(12) United States Patent
Howell

(10) Patent No.: US 9,471,719 B2
(45) Date of Patent: Oct. 18, 2016

(54) EFFICIENT LIGHTING EFFECTS IN DESIGN SOFTWARE

(71) Applicant: DIRTT Environmental Solutions, Ltd., Calgary (CA)

(72) Inventor: Joseph S. Howell, Uintah, UT (US)

(73) Assignee: DIRTT Environmental Solutions, LTD, Calgary (CA)

( * ) Notice: Subject to any disclaimer, the term of this patent is extended or adjusted under 35 U.S.C. 154(b) by 0 days.

(21) Appl. No.: 14/348,879

(22) PCT Filed: Dec. 10, 2012

(86) PCT No.: PCT/US2012/068805
§ 371 (c)(1),
(2) Date: Mar. 31, 2014

(87) PCT Pub. No.: WO2014/092680
PCT Pub. Date: Jun. 19, 2014

(65) Prior Publication Data
US 2015/0302116 A1    Oct. 22, 2015

(51) Int. Cl.
*G06T 15/06* (2011.01)
*G06T 15/50* (2011.01)
(Continued)

(52) U.S. Cl.
CPC ......... *G06F 17/5004* (2013.01); *G06F 3/0482* (2013.01); *G06F 3/04842* (2013.01); *G06F 17/10* (2013.01); *G06T 15/06* (2013.01); *G06T 15/506* (2013.01); *G06T 15/80* (2013.01); *G06T 2210/04* (2013.01); *G06T 2215/12* (2013.01)

(58) Field of Classification Search
CPC ... G06F 17/5004; G06F 17/10; G06T 15/06; G06T 15/506; G06T 15/80; G06T 2210/04; G06T 2215/12
See application file for complete search history.

(56) References Cited

U.S. PATENT DOCUMENTS 3,972,163 A    8/1976  Coperthwaite
4,207,714 A    6/1980  Mehls
(Continued)

FOREIGN PATENT DOCUMENTS

EP    1066579    1/2002
JP    02039377   2/1990
(Continued)

OTHER PUBLICATIONS

BeLight, Live Interior 3D Pro User's Manual, 2010.*
(Continued)

*Primary Examiner* — Jacinta M Crawford
*Assistant Examiner* — Phuc Doan
(74) *Attorney, Agent, or Firm* — Workman Nydegger

(57) ABSTRACT

A computerized method of for rendering a lighting effect can include receiving from a user inputs regarding the location of an object within a design space. Furthermore, the method can include receiving from the user one or more inputs regarding the location of one or more light sources within the design space. Additionally, the method can include calculating a lighting effect of the one or more lights on the object within the design space. Furthermore, the method can include rendering the lighting effect during a time interval that is independent of the number of the one or more light sources within the design space, such that rendering the lighting effect for one of the one or more light sources takes the same amount of time as rendering the lighting effect for a plurality of the light sources.

20 Claims, 9 Drawing Sheets

(51) Int. Cl.
*G06T 15/80* (2011.01)
*G06F 17/50* (2006.01)
*G06F 3/0484* (2013.01)
*G06F 3/0482* (2013.01)
*G06F 17/10* (2006.01)

(56) References Cited

U.S. PATENT DOCUMENTS

| | | | |
|---|---|---|---|
| 4,705,401 | A | 11/1987 | Addleman |
| 5,625,827 | A | 4/1997 | Krause |
| 5,673,374 | A | 9/1997 | Sakaibara |
| 5,801,958 | A | 9/1998 | Dangelo |
| 5,870,771 | A | 2/1999 | Oberg |
| 6,078,332 | A | 6/2000 | Ohazama |
| 6,097,394 | A | 8/2000 | Levoy |
| 6,268,863 | B1 | 7/2001 | Rioux |
| 6,292,810 | B1 | 9/2001 | Richards |
| 6,493,679 | B1 | 12/2002 | Rappaport |
| 6,580,426 | B1 | 6/2003 | Small |
| 6,629,065 | B1 | 9/2003 | Gadh |
| 6,900,841 | B1 | 5/2005 | Mihara |
| 6,971,063 | B1 | 11/2005 | Rappaport |
| 7,019,753 | B2 | 3/2006 | Rappaport |
| 7,062,454 | B1 | 6/2006 | Giannini |
| 7,085,697 | B1 | 8/2006 | Rappaport |
| 7,096,173 | B1 | 8/2006 | Rappaport |
| 7,099,803 | B1 | 8/2006 | Rappaport |
| 7,155,228 | B2 | 12/2006 | Rappaport |
| 7,171,208 | B2 | 1/2007 | Rappaport |
| 7,216,092 | B1 | 5/2007 | Weber |
| 7,243,054 | B2 | 7/2007 | Rappaport |
| 7,246,045 | B1 | 7/2007 | Rappaport |
| 7,299,168 | B2 | 11/2007 | Rappaport |
| 7,299,416 | B2 | 11/2007 | Jaeger |
| 7,623,137 | B1 | 11/2009 | Miller |
| 7,817,823 | B1 | 10/2010 | O'Donnell |
| 7,825,937 | B1 * | 11/2010 | Sakhartchouk ....... G06T 15/503 345/426 |
| 8,255,338 | B1 | 8/2012 | Brittan |
| 8,271,336 | B2 | 9/2012 | Mikurak |
| 8,276,008 | B2 | 9/2012 | Jackson |
| 8,285,707 | B2 | 10/2012 | Day |
| 8,290,849 | B2 | 10/2012 | Eisler |
| 8,301,527 | B2 | 10/2012 | Tarbox |
| 8,332,401 | B2 | 12/2012 | Hull |
| 8,332,827 | B2 | 12/2012 | Edde |
| 8,335,789 | B2 | 12/2012 | Hull |
| 8,386,918 | B2 | 2/2013 | Do |
| RE44,054 | E | 3/2013 | Kim |
| 8,402,473 | B1 | 3/2013 | Becker |
| 8,423,391 | B2 | 4/2013 | Hessedenz |
| 8,442,850 | B2 | 5/2013 | Schorr |
| 8,510,382 | B2 | 8/2013 | Purdy |
| 8,521,737 | B2 | 8/2013 | Hart |
| 8,566,419 | B2 | 10/2013 | Purdy et al. |
| 8,600,989 | B2 | 12/2013 | Hull |
| 8,626,877 | B2 | 1/2014 | Greene |
| 8,645,973 | B2 | 2/2014 | Bosworth |
| 8,650,179 | B2 | 2/2014 | Driesch |
| 8,773,433 | B1 | 7/2014 | Smyrl |
| 2001/0044707 | A1 | 11/2001 | Gavin et al. |
| 2004/0027371 | A1 | 2/2004 | Jaeger |
| 2004/0075655 | A1 | 4/2004 | Dunnett |
| 2004/0100465 | A1 | 5/2004 | Stowe |
| 2004/0174358 | A1 | 9/2004 | Takagi |
| 2005/0072059 | A1 | 4/2005 | Hodsdon |
| 2005/0104883 | A1 * | 5/2005 | Snyder ................... G06T 15/50 345/426 |
| 2006/0274064 | A1 | 12/2006 | Dougherty |
| 2007/0098290 | A1 | 5/2007 | Wells |
| 2007/0109310 | A1 | 5/2007 | Xu |
| 2007/0276791 | A1 | 11/2007 | Fejes |
| 2009/0145075 | A1 | 6/2009 | Oakley |
| 2009/0187389 | A1 | 7/2009 | Dobbins |
| 2010/0018141 | A1 | 1/2010 | Kelly |
| 2010/0128038 | A1 * | 5/2010 | Hoffman ............... G06T 15/506 345/426 |
| 2010/0268513 | A1 | 10/2010 | Loberg |
| 2011/0227922 | A1 | 9/2011 | Shim |
| 2011/0227924 | A1 | 9/2011 | Nakajima |
| 2011/0265405 | A1 | 11/2011 | Ksenych |
| 2012/0288184 | A1 | 11/2012 | Zomet |
| 2014/0095122 | A1 | 4/2014 | Appleman |

FOREIGN PATENT DOCUMENTS

| | | |
|---|---|---|
| JP | 2000132706 | 5/2000 |
| JP | 2007264707 | 10/2007 |
| WO | 02059545 | 8/2002 |
| WO | 2007138560 | 12/2007 |
| WO | 2013040016 | 3/2013 |

OTHER PUBLICATIONS

Wynn, Cube Maps, 2001, URL: https://developer.nvidia.com/sites/default/files/akamai/gamedev/docs/CubeMaps.pdf.*

Drettakis, Interactive Update of Global Illumination Using a Line-Space Hierarchy, ACM SIGGRAPH 97.*

Chuang, Efficient Image-Based Methods for Rendering Soft Shadows, 2006, URL: http://www.csie.ntu.edu.tw/~cyy/courses/rendering/06fall/lectures/handouts/lec15_sshadow1.pdf.*

International Search Report and Opinion, PCT/US2013/045047, mailed Mar. 3, 2014.

International Search Report and Opinion, PCT/US2013/043735, mailed Feb. 27, 2014.

International Search Report and Opinion, PCT/US2013/050764, mailed Feb. 27, 2014.

CG Blog; "Photoshop tutorial and post-production glasses"; Retrieved online from; www.grafica3dblog.it/photoshop_tutorial_glass.htm; pp. 1-7.

International Search Report and Written Opinion for PCT/US2013/024063 mailed Oct. 25, 2013.

International Search Report and written opinion for PCT/US2013/023198 mailed Oct. 18, 2013.

International Search Report and Written Opinion for PCT/US2013/024009 mailed Oct. 25, 2013.

Ravi Mamoorthi et al., "A First-Order Analysis of Lighting, Shading, and Shadows," ACM Transactions on Graphics, vol. 26, No. 1, Article 2, Jan. 31, 2007. See p. 2, 8, and 12-15.

Erco, "Erco Guide," http://www.erco.com/download/ data/30_media/_guide_pdf/ 120_en/_erco_guide_7_simulation.pdf, May 12, 2006. See p. 376, 389-388, 399, and 427.

Joseph Zupko et al., "System for Automated Interactive Lighting (SAIL)," in: Proceedings for the 4th International Conference on Foundations of Digital Games, 2009, pp. 223-230. See pp. 223-226.

Maxwell Render, "Maxwell Render 2.5 User Manual," http://www.architektur.uni-kl.de/digitalewrkzeuge/ss13/digitalewerkzeuge/maxwel-english.pdf, Dec. 31, 2010. See p. 22-25, 36-37, and 48-49.

Jeremy Birn, "Digital Lighting and Rendering," Pearson Education, 2nd ed., 2006, ISBN 0132798212. See p. 35-59.

Pierre-Felix Breton, "Autodesk Revit and 3ds Max Design for Lighting and Daylighting simulation," http://www.pfbreton.com/wordpress/wp-content/uploads/2012/05/L12L07%20Handout.pdf, May 7, 2012. See pp. 28, 51-52, and 87-103.

David Cohn, "Photorealistic Rendering Techniques in AutoCAD3D," Autodesk University 2009, http://www.dscohn.com/AU/handouts/AU214-2%20-%20Photorealistic%20Rendering%20Techniques%20in%20AutoCAD%203D.pdf, Dec. 31, 2009. See pp. 4-6.

International Search Report and Written Opinion for PCT/US2012/068805 mailed Aug. 29, 2013.

Ram Schacked et al.: "Automatic Lighting Design Using a Perceptual Quality Metric"; 2001; Eurographic 2011 vol. 20 (2001); p. 1-12.

(56) References Cited

OTHER PUBLICATIONS

Notice of Allowance for U.S. Appl. No. 14/113,260 mailed Mar. 23, 2016.
International Search Report and Opinion, PCT/US2015/011105, mailed May 5, 2015.
Final Office Action for U.S. Appl. No. 14/110,910 mailed Feb. 2, 2016.
Non-Final Office action for U.S. Appl. No. 14/113,260 mailed Sep. 14, 2015.
Non-Final Office Action for U.S. Appl. No. 14/110,910 mailed for Sep. 14, 2015.
Cruless, Ray Tracing URL: http://courses.cs.washington.edu/courses/cse557/09au/lectures/ray-tracing.pdf, Washington University, CSE 557 Falll 2009. pp. 1-40.
Non-Final Office Action in U.S. Appl. No. 14/110,910 mailed on Aug. 12, 2016.

* cited by examiner

EFFICIENT LIGHTING EFFECTS IN DESIGN SOFTWARE

CROSS-REFERENCE TO RELATED APPLICATIONS

The present invention is 35 U.S.C. §371 National Stage application corresponding to PCT/US12/68805, filed on Dec. 10, 2012, entitled "Efficient Lighting Effects in Design Software," the entire content of which is incorporated by reference herein.

BACKGROUND OF THE INVENTION

1. The Field of the Invention

The present invention relates generally to computer-aided design or drafting software.

2. Background and Relevant Technology

As computerized systems have increased in popularity so have the range of applications that incorporate computational technology. Computational technology now extends across a broad range of applications, including a wide range of productivity and entertainment software. Indeed, computational technology and related software can now be found in a wide range of generic applications that are suited for many environments, as well as fairly industry-specific software.

One such industry that has employed specific types of software and other computational technology increasingly over the past few years is that related to building and/or architectural design. In particular, architects and interior designers ("or designers") use a wide range of computer-aided design (CAD) software for designing the aesthetic as well as functional aspects of a given residential or commercial space. For example, a designer might use a CAD program to design the interior layout of an office building. The designer might then render the layout to create a three-dimensional model of the interior of the office building that can be displayed to a client.

While three-dimensional rendering is becoming a more common feature in CAD programs, three-dimensional rendering is a fairly resource intensive process. For example, a traditional rendering program can take anywhere from several minutes to several hours to appropriately render all of the lighting and shading effects of a given space with accuracy. This may be particularly inconvenient to a designer who has to wait for the scene to render after making a change to the layout of the scene. Alternatively, some rendering programs may use methods of rendering that result in less realistic images to speed up the rendering and use fewer resources. Such programs may do so by, for example, rendering fewer features within the scene or by using pre-rendered elements that do not necessarily correspond with the actual scene being rendered.

For example, one conventional mechanism to increase rendering speed is by pre-baking all or part of the entire scene. In some cases, for example, the layout of a scene may be rendered well before the user's interaction with the scene. In other cases, certain features of a scene will be pre-rendered using generic assumptions about lighting sources and later added to a customized or variable scene to minimize rendering resources when the user encounters that particular feature. One will appreciate that this approach relies on advanced knowledge of the scene layout and components, or, alternatively, a minimalist view of the scene that sacrifices realism for processing speed.

Some of the more complex effects in rendering have to do with lighting. With specific respect to light or lighting effects some conventional mechanisms increase rendering speed by only accounting for a small number of light sources in a scene. Doing this may increase the rendering speed by lowering the number of lighting and shading effects that are calculated. This method of ignoring light sources within a scene results in a three-dimensional model with less realistic lighting and shading effects.

Accordingly, there are a number of problems in the art relating to rendering lighting and shading effects in three-dimensional scenes in real-time that can be addressed.

BRIEF SUMMARY OF THE INVENTION

Implementations of the present invention overcome one or more problems in the art with systems, methods, and apparatus configured to provide a real-time rendering time for rendering a lighting portion of a scene irrespective of the number of light sources within the scene. In particular, at least one implementation of the present invention uses a volume cube map to pre-calculate the lighting effects of the scene. Additionally, at least one implementation uses multiple volume cube maps, each volume cube map having a different assumed normal. At least one implementation of the present invention allows a user to render in real-time a scene with lighting effects that account for the influences of multiple lights.

For example, a method in accordance with at least one implementation of rendering the lighting effects of a scene during a consistent time interval irrespective of the number of light sources within the scene can include receiving from a user one or more user inputs regarding a location of an object in a design space. The method can also include receiving from the user one or more user inputs regarding a location of one or more lights within the design space, wherein the one or more light sources project onto the object. In addition, the method can include calculating a lighting effect of the one or more lights on the object in the design space. Furthermore, the method can include rendering the lighting effect during a time interval that is independent of the number of the one or more light sources within the design space. As such, rendering the lighting effect for one of the one or more light sources takes the same amount of time as rendering the lighting effect for a plurality of the light sources.

In an additional or alternative implementation, a method for rendering a lighting effect from a light source on an object within a design space can include receiving from a user one or more inputs regarding a location of the object in the design space. The method can also include calculating a voxel. In such a case, the voxel represents at least a discrete portion of the object in the design space. In addition, the method can include assigning at least one surface vector to the voxel, wherein the at least one surface vector extends from the voxel. Furthermore, the method can include calculating lighting information generated by the light source on the voxel by combining a light source vector extending from the light source and the at least one surface vector. Still further, the method can include rendering, using the lighting information, the lighting effect on the discrete portion of the object in the design space.

These and other objects and features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. It should be noted that the figures are not drawn to scale, and that elements of similar structure or function are generally represented by like reference numerals for illustrative purposes throughout the figures. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
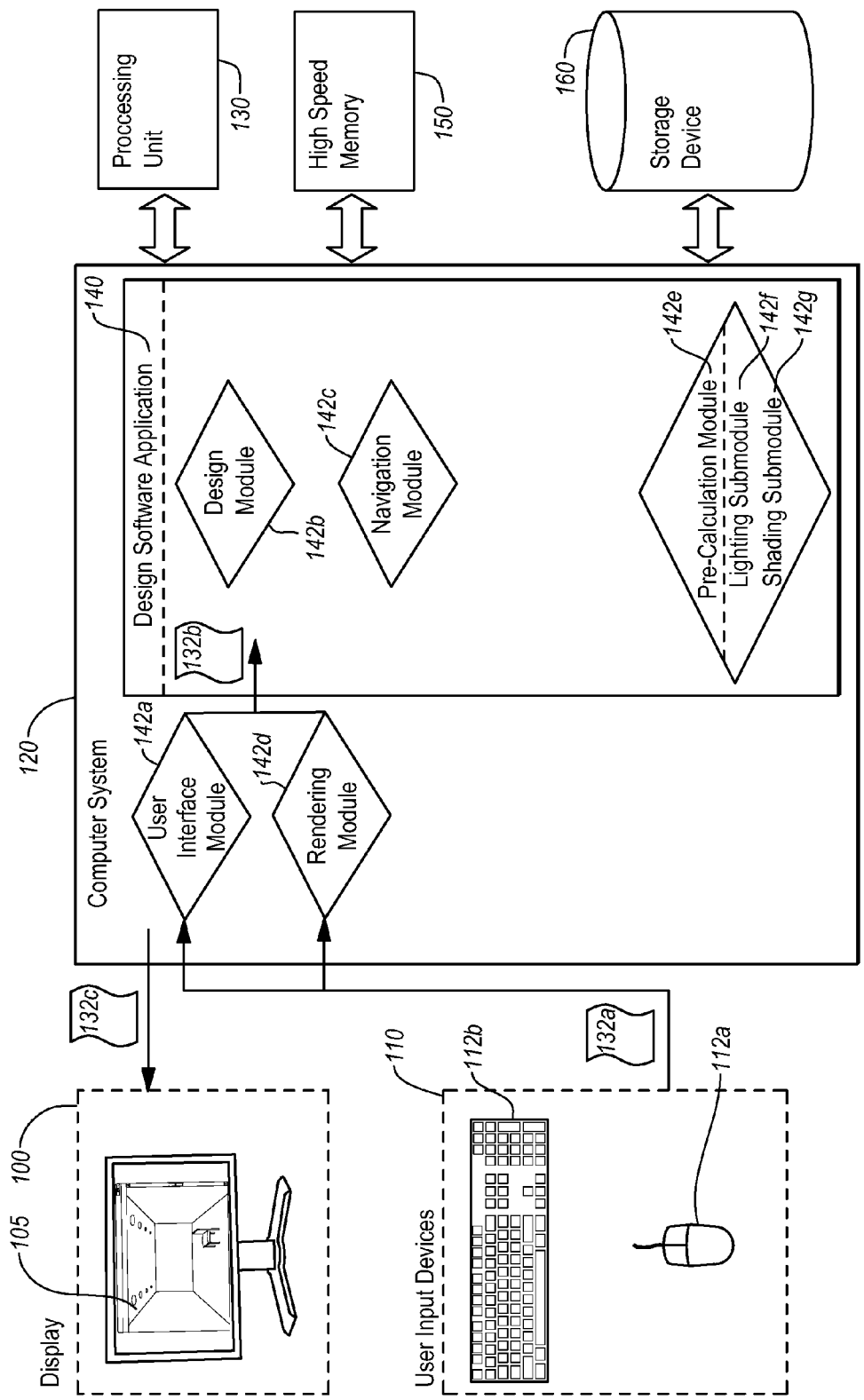
FIG. 1 illustrates an architectural schematic diagram of a system for providing a real-time calculation of a lighting portion of a scene irrespective of the number of light sources within the scene.

Implementations of the present invention extend to systems, methods, and apparatus configured to provide a real-time rendering time for rendering a lighting portion of a scene irrespective of the number of light sources within the scene. In particular, at least one implementation of the present invention uses a volume cube map to pre-calculate the lighting effects of the scene. Additionally, at least one implementation uses multiple volume cube maps, each volume cube map having a different assumed normal. At least one implementation of the present invention allows a user to render in real-time a scene with lighting effects that account for the influences of multiple lights.

For example, at least one implementation relates to providing a real-time calculation time for calculating a lighting portion of a scene irrespective of the number of light sources within the three-dimensional model. In at least one implementation, the lighting portion of a scene includes the shadows cast by objects within the three-dimensional model and shading of the various objects within the three-dimensional model. As used within this application, shading effects are a subset of lighting effects; however, in at least one implementation, the shading effects are calculated separately from at least a portion of the other lighting effects. The system, software, and methods of the present invention can calculate the influences of multiple light sources within a three-dimensional model and render the influences in real-time. As used herein, "a real-time calculation time" is with respect to the actual rendering of the three-dimensional model. In at least one implementation, the lighting portion may be pre-calculated in a non-constant time with respect to the number of light sources within the three-dimensional model.

Once the lighting effects from the multiple light sources are calculated, the system enables the user to navigate about the three-dimensional model in real-time. As a user navigates within the three-dimensional model, the system re-renders the model—as displayed to the user—to depict each unique view that the user's perspective within the three-dimensional model requires. Each unique view can, in turn, include lighting and shading effects that are being influenced by multiple light sources. Thus, at least one implementation allows a user to freely navigate within the three-dimensional model while experiencing real-time rendering of the lighting and shading effects caused by multiple light sources within the model.

In at least one implementation, the system enables the user to selectively activate or de-activate individual lights within the three-dimensional model, and then see the three-dimensional model rendered in real-time with the model depicting the change in active light sources. For example, the system can enable the user to select a light source within a conference room that is depicted within the three-dimensional model and activate the light source. In at least one implementation, the conference room will be rendered in real-time to depict the room with the additional light source activated. Although, when a user makes changes to the active light sources within the three-dimensional model a non-constant pre-calculation period may elapse, the actual rendering of the scene will typically occur in real-time.

Additionally, at least one implementation allows a user to make design changes to the three-dimensional model. For example, a user may be able to place new objects within the model, adjust the physical characteristics of the model, or change the number and type of light sources within the model. In at least one implementation, the system allows the user to make changes to the model while the model is depicted as a two-dimensional schematic that is later rendered into a three-dimensional model. In at least one implementation after the design changes are made, the lighting portion of the three-dimensional model is pre-calculated. The system then renders the three-dimensional model, including the design changes, in real-time without respect to the number of light sources that are within the model.

In addition, at least one implementation of the present invention includes systems and methods for generating volume maps that contain pre-calculated lighting and shading information for the three-dimensional model. In at least one implementation, prior to rendering the three-dimensional model, at least a portion of the model is transformed into one or more volume maps. As used herein, a "volume map" refers to a mapping of the model where the model is divided into multi-dimensional, discrete portions. In at least one implementation, the lighting portion of the three-dimensional model is pre-calculated with respect to at least one of the multi-dimensional, discrete portions within the volume map. In other words, each multi-dimensional, discrete portion of the volume map contains the pre-calculated lighting information for the corresponding portion of the three-dimensional model.

In particular, at least one implementation of the present invention utilizes multiple volume maps when rendering the three-dimensional model. For instance, at least one implementation of the present invention pre-calculates the lighting portion of a three-dimensional model within multiple volume maps, where each volume map is pre-calculated using a different "assumption" (e.g., assumption about a vector extending from at least one of the multi-dimensional, discrete portions within the volume map). For example, volume maps may be pre-calculated using different assumptions about the normal vectors of the various multi-dimensional, discrete portions within the volume map, the height of various light sources within the three-dimensional model, the reflectivities of various surfaces within the three-dimensional model, or any other applicable assumption.

Accordingly, one will appreciate in view of the specification and claims herein that at least one implementation of the present invention provides the ability to perform real-time rendering of three-dimensional models while accounting for the influences of multiple light sources. Specifically, at least one implementation of the present invention allows a user to create a three-dimensional model that contains multiple light sources. The user can then navigate about the three-dimensional model while having the lighting and shading effects from the multiple light sources rendered in real-time.

FIG. 1 depicts an architectural schematic diagram of a computer system 120 for calculating in real-time a lighting portion of a scene irrespective of the number of light sources within the scene. In particular, FIG. 1 shows user input devices 110 that communicate with the computer system 120, which in turn communicates with a display 100. FIG. 1 shows that the user input devices 110 can include any number of input devices or mechanisms, including but not limited to a mouse 112a, a keyboard 112b, or other forms of user input devices.

In addition, FIG. 1 shows that computer system 120 comprises a design software application 140 executed by a processing unit 130. One will appreciate that the processing unit 130 can comprise a central processing unit, a graphics processor, a physics processor, or any other type of processing unit. FIG. 1 further shows that the computer system 120 can comprise a memory (e.g., a high speed memory) 150, and a storage 160. In one implementation, storage device 160 can contain, among other things, templates and objects that can be placed within a three-dimensional model 105. These components, in conjunction with processing unit 130, store and execute the instructions of design software application 140.

FIG. 1 shows that a user in this case uses the input device(s) 110 to send one or more requests 132a to the computer system 120. In one implementation, the processing unit 130 implements and/or executes the requests from user input devices 110, and application 140 instructions. For example, a user can provide one or more inputs 132a relating to the design and rendering of a three-dimensional model 105 within a design software application 140, as executed by processing unit 130. FIG. 1 further shows that the design software application 140 can then pass the inputs 132b to the appropriate modules within the design software application 140.

Ultimately, design application 140 can then send corresponding rendering instructions 132c through rendering module 140d to display 100. As shown in FIG. 1, for example, display 100 displays a graphical user interface in which the user is able to interact (e.g., using the user input devices 110). In particular, FIG. 1 shows that the graphical user interface can include a depiction of a three-dimensional model 105 of a design space comprising in this case a chair and one or more lighting elements.

One will appreciate in view of the specification and claims herein that the user interface module 142a can provide to the user an option to make design changes to the three-dimensional model 105. In one implementation, for example, upon receiving a request for some modification, the user interface module 142a can communicate the request to the design module 142b. One will appreciate that the design module 142b can then provide the user with the ability to, among other options, place new objects within the three-dimensional model 105, manipulate and change objects that are already within the three-dimensional model 105, adjust light sources within the three-dimensional model 105, or change parameters relating to the three-dimensional model 105. In some cases, this can include the design module 140b communicating with the storage device 160 to retrieve, among other things, templates and objects that can be placed within a three-dimensional model 105.

After receiving and processing a user input/request, the design module 142b can then send a corresponding request to the rendering module 142d for further processing. In one implementation, this further processing includes rendering module 142d rendering the depiction of the three-dimensional model 105 shown in this case on the display 100 in FIG. 1. One will appreciate that the rendered depiction can include shading and lighting effects within the three-dimensional model 105. The rendering module 142d can then communicate with the memory (e.g. high speed memory 150) and the storage device 160. In one implementation, information that is accessed frequently and is speed-sensitive will be stored within the memory 150. In particular, the memory 150 can comprise information relating to the lighting and shading of the three-dimensional model.

FIG. 1 further shows that the rendering module 142d can communicate with a pre-calculation module 142e. In one implementation, the pre-calculation module 142e can calculate the lighting and shading information for a three-dimensional model 105, and store the information within the memory 150. Specifically, the pre-calculation module 142e can calculate the effect of multiple light sources within the three-dimensional model 105 and store those calculations within a volume map that is stored within the memory 150. The rendering module 142d, using the calculations, can then render the three-dimensional model 105 in real-time without respect to the number of light sources that are contained within the three-dimensional model 105.

When the user changes the design within the three-dimensional model 105, the pre-calculation module 142e can automatically recalculate the lighting and shading effects taking into account the design change. In at least one implementation, the pre-calculation module 142e can calculate the lighting and shading effects within either the entire three-dimensional model 105 or just a portion of the three-dimensional model 105. For example, FIG. 1 shows that the pre-calculation module 142e can comprise a lighting sub-module 142f. In at least one implementation, lighting sub-module 142*f* is configured to calculate one or more lighting effects caused by one or more light sources within the three-dimensional model 105. In addition, FIG. 1 shows that the pre-calculation module 142*e* can comprise a shading sub-module 142*g*. In one implementation, shading sub-module 142*g* is configured to calculate one or more shading effects that are caused by one or more light sources within the three-dimensional model 105.

Once the pre-calculation module 142*e* has initially calculated the lighting and shading effects within the three-dimensional model and created the volume maps, in at least one implementation, the volume maps will not be recalculated until a design change is made to the three-dimensional model 105. The time required to complete the calculations performed by the pre-calculation module 142*e* may increase depending upon the number of light sources within the three-dimensional model 105. As understood more fully herein, however, the amount of time required by the rendering module 142*d* to render the three-dimensional model 105 can remain constant. In at least one implementation, the calculations performed by the pre-calculation module 142*e* can allow the rendering module 142*d* to render the three-dimensional model 105 in real-time without respect to the number of light sources contained within the three-dimensional model 105.

In addition, implementations of the present invention can include a user interface module 142*a* that can provide the user an option to navigate through the three-dimensional model 105. Upon receiving such a request for positioning of a user view, one will appreciate that the user interface module 142*a* can communicate the corresponding request to the navigation module 142*c*. In at least one implementation, the navigation module 142*c* can thus provide the user with the ability to change their perspective within the three-dimensional model 105, and to travel throughout the three-dimensional model 105. For example, the navigation module 142*c* can enable a user to travel from a conference room to a lobby within the three-dimensional model 105.

Each time the user changes their perspective or position within the three-dimensional model 105, the navigation module 142*c* can then communicate with the rendering module 142*d*, which renders the new perspective of three-dimensional model 105 as depicted on the display 100. In at least one implementation, the rendering module 142*d* accesses the volume maps that were previously created by the pre-calculation module 142*e*. Using the lighting information contained within the volume maps, the rendering module 142*d* renders the new perspective of the three-dimensional model 105 in real-time. As a user navigates through or makes design changes to the three-dimensional model 105, the design application 140 can continually update display 100 to depict the new perspectives.

Figure 2:
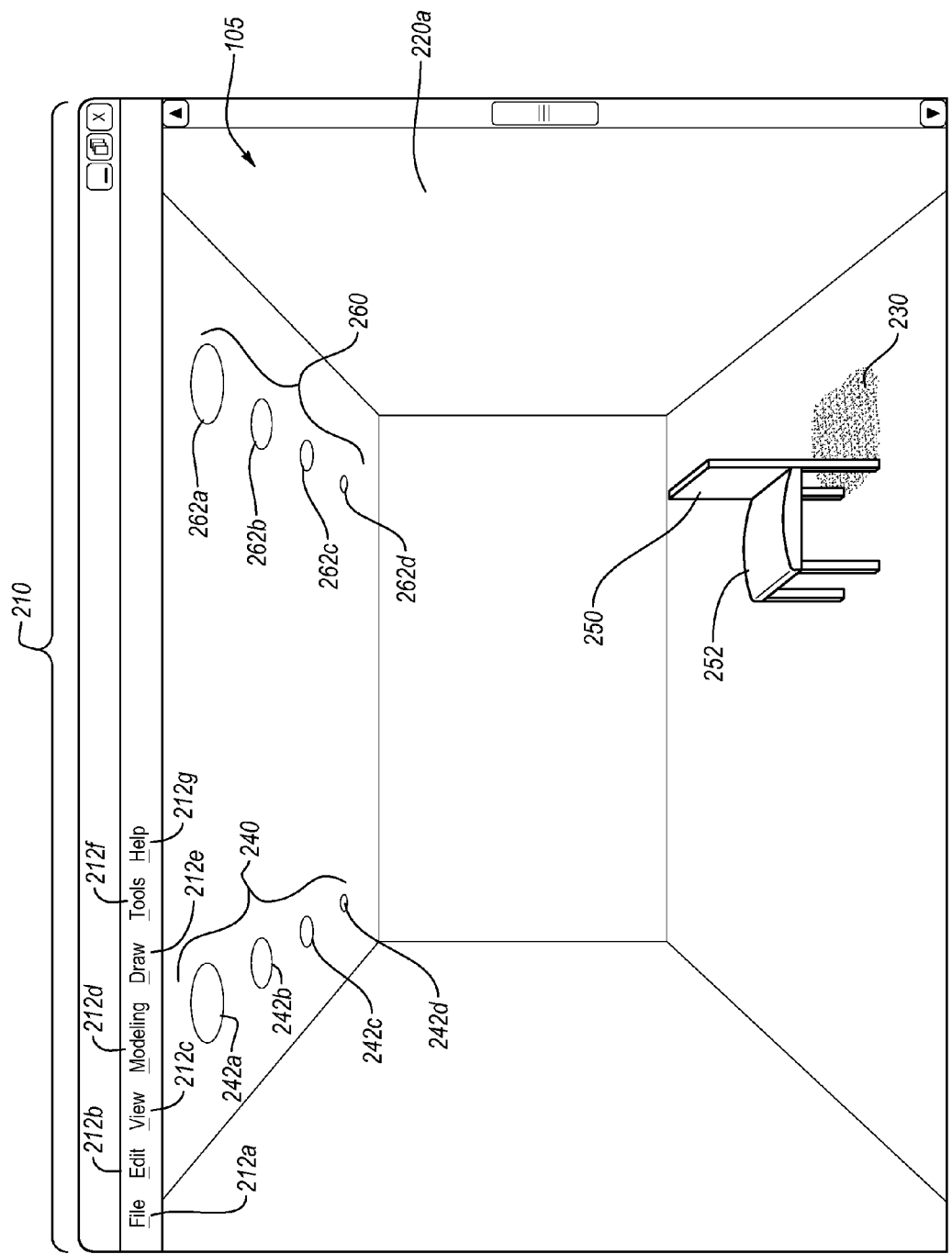
FIG. 2 illustrates a computer display showing a design space with multiple light sources within the scene.

FIG. 2 depicts a user interface showing a three-dimensional model 105 of a room 220*a* containing a chair 250 and two groups of light sources 260, 240. In this case, FIG. 2 also shows that the user interface can comprise a menu bar 210. In the illustrated implementation, menu bar 210 displays various options such as File 212*a*, Edit 212*b*, View 212*c*, Modeling 212*d*, Draw 212*e*, Tools 212*f*, and Help 212*g*. It should be understood, however, that these menu options are merely exemplary and menu bars 210 within different implementation may comprise more, less, or different menu options. In at least one implementation, the menu bar 210 provides the user with options for creating, interacting with, and manipulating the three-dimensional model 105. For example, FIG. 2 shows that a user has used the three-dimensional model 105 to create room 220*a*, and to place chair 250 within the room.

In this case, FIG. 2 also shows that the user has also placed within the ceiling each of the eight light sources 242(*a-d*), and 262(*a-d*). In particular, FIG. 2 illustrates an example in which the light sources 242, 262 are arranged predominantly within two different rows 240, 260. One will appreciate that the different placement of the two rows of lights 240, 260, along with the unique placement of each light within the rows, can create unique shading effects that depend upon the individual placement and intensity of each light source 242, 262. For example, FIG. 2 shows that the chair 250 is casting a shadow 230. The location and darkness of the shadow 230 is influenced by the location, direction, intensity, and color each light 242*a*, 242*b*, 242*c*, 242*d*, 262*a*, 262*b*, 262*c*, 262*d*. Similarly, one will appreciate that the shading and color of the seat cushion 252 can be influenced by the location, direction, intensity, and color of each light 242*a*, 242*b*, 242*c*, 242*d*, 262*a*, 262*b*, 262*c*, 262*d*.

As understood more fully herein, as the user navigates within the room, the three-dimensional model 105 can constantly re-render the information to display each new perspective and change in lighting effect, if applicable. The change in lighting effect can occur when the user activates, deactivates, moves, or deletes various light sources.

For example, a user can deactivate a light source (e.g., 262*d*) within the room 220*a*. The system can then recalculate the lighting effects and shading effects of the three-dimensional model 105 through pre-calculation module 142*e*. In at least one implementation, this includes pre-calculation module 142*e* calculating the influence of every light source within the room 220*a* except light source 262*d*.

For example, the pre-calculation module 142*e* can create one or more volume maps that contain the lighting and shading information of at least a portion of the three-dimensional model 105. The rendering module 142*d* can then render the three-dimensional model 105 showing the lighting and shading effects caused by all of the light sources except the de-activated light source 262*d*. Within the re-rendered room 220*a*, the rendering module 142*d* adjusts the shadow 230 to reflect the lack of influence from light source 262*d*, and further adjusts the color and shading of the seat cushion 252 to reflect the de-activation of light source 262*d*.

Additionally, in at least one implementation, when a user makes a change to the three-dimensional model 105, the pre-calculation module 142*e* can recalculate only those portions of the three-dimensional model that were influenced by the change. For example, if the design module 142*b* received an indication from a user to move the chair 250 of FIG. 2, then the changes to the lighting effects would predominantly be centered around the previous location of the chair 250 and the new location of the chair 250. The pre-calculation module 142*e*, in at least one implementation, can be more efficient by only recalculating those areas where the lighting effect has changed. Similarly, in a three dimensional model 105 with multiple rooms, a change within one room may not influence the lighting effects in the other rooms. In at least one implementation, the pre-calculation module can recalculate the lighting effects within a single room as opposed to recalculating the lighting effects within every room in the three-dimensional model 105.

Figure 3:
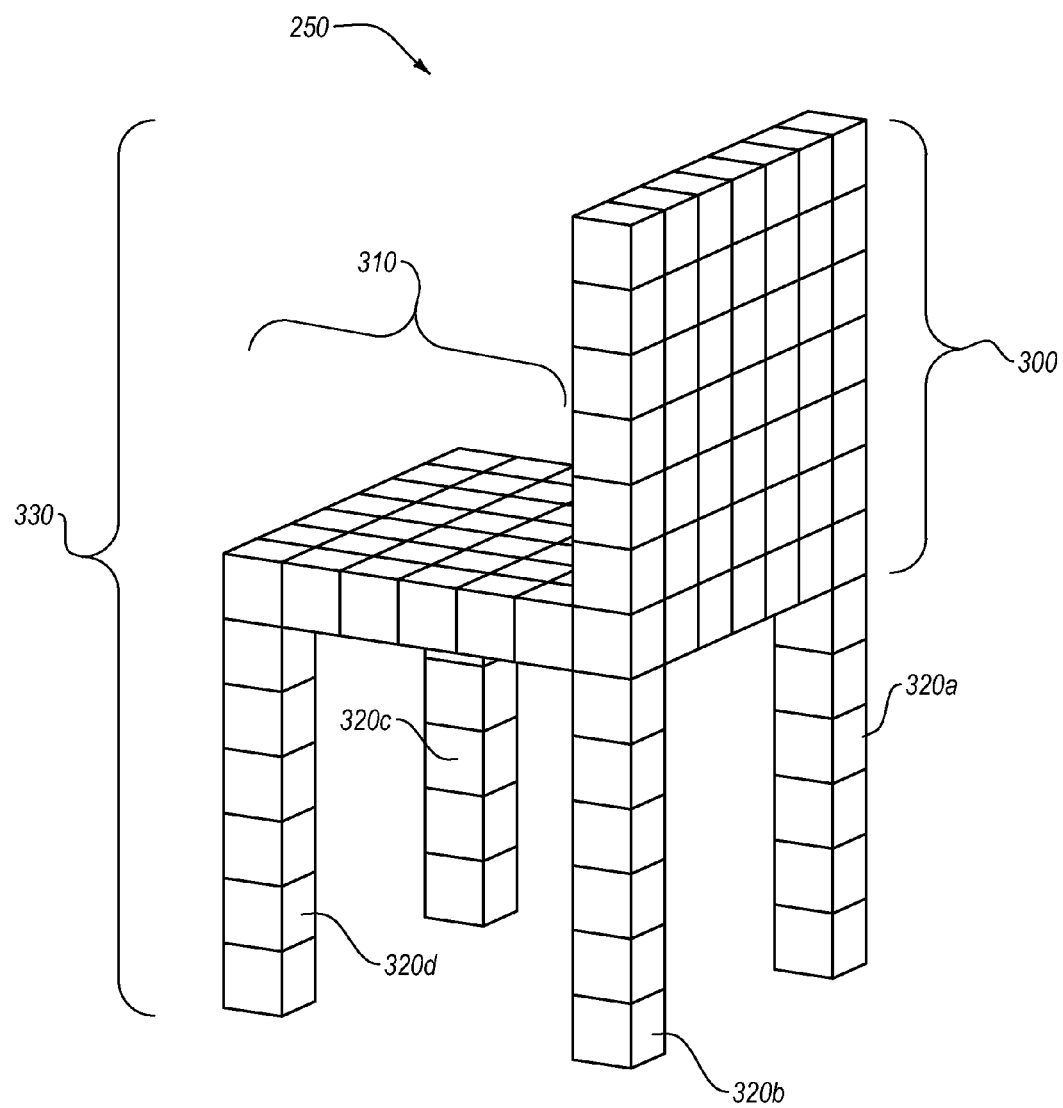
FIG. 3 illustrates the chair of FIG. 2 depicted as a collection of voxels.

In any event, prior to calculating the influence of multiple light sources within a three-dimensional model, the pre-calculation module 142*e* can create one or more volume maps of at least a portion of the room. In at least one implementation, this includes the pre-calculation module 142e creating a volume map of at least a portion of the three-dimensional model by using a collection of "voxels" (i.e., volume pixels illustrated as discrete cubes). For example, FIG. 3 depicts a "voxelized" chair 330, which corresponds to chair 250 (FIG. 2). FIG. 3 shows that the voxelized chair 330 is constructed of a collection of voxels (illustrated as discrete cubes) that partially mimics the shape and size of chair 250. For example, the voxelized chair 330 of FIG. 3 has four voxelized legs 320a, 320b, 320c, 320d, each of which is constructed of voxels. Similarly, FIG. 3 depicts the voxelized chair 330 as having a voxelized chair back 300 and a voxelized chair cushion 310 constructed of voxels.

In at least one implementation, the system divides the room (or whatever happens to be the design space being worked on by the user) into equal-sized multi-dimensional, discrete portions. Each discrete portion of the room, in turn, can then be assigned relative to the three-dimensional model that the discrete portion of the room encompasses. For example, if a particular discrete portion only encompasses air (i.e., there are no objects in that portion of the room) then that portion can be assigned as representing air. Similarly, if a particular discrete portion of the room only encompasses a portion (or all of) of chair 250, then the particular discrete portion will be assigned as representing the portion of chair 250 (or all of the chair, as the case may be). In at least one implementation, the discrete portions have two states—one that indicates that the voxel encompass an object (e.g., an "on" or "occupied" state) and one that indicates that the voxel does not encompass an object (e.g., an "off" or "unoccupied" state).

One will appreciate that at least one discrete portion may encompass both air and a portion of chair 250. To determine whether the particular discrete portion should be assigned relative to what is contained within it (e.g., as representing air or representing a portion of the chair 250), in at least one implementation the pre-calculation module 142e can use a best fit algorithm. The best fit algorithm can determine whether the multi-dimensional space that the particular discrete portion encompasses is primarily made up of air or a portion of chair 250, and then assign the particular discrete portion accordingly. In at least one implementation, the best fit algorithm can be biased, such that a particular discrete portion can be assigned to be a portion of the chair 250, even though the multi-dimensional space that the particular discrete portion encompasses contains more than 50% air. Additionally, in at least one implementation the best fit algorithm can be performed by a graphics processing unit (not shown), which can provide the calculated assignment (i.e., on/occupied versus off/unoccupied) for each discrete portion to the pre-calculation module 142e.

Figure 4:
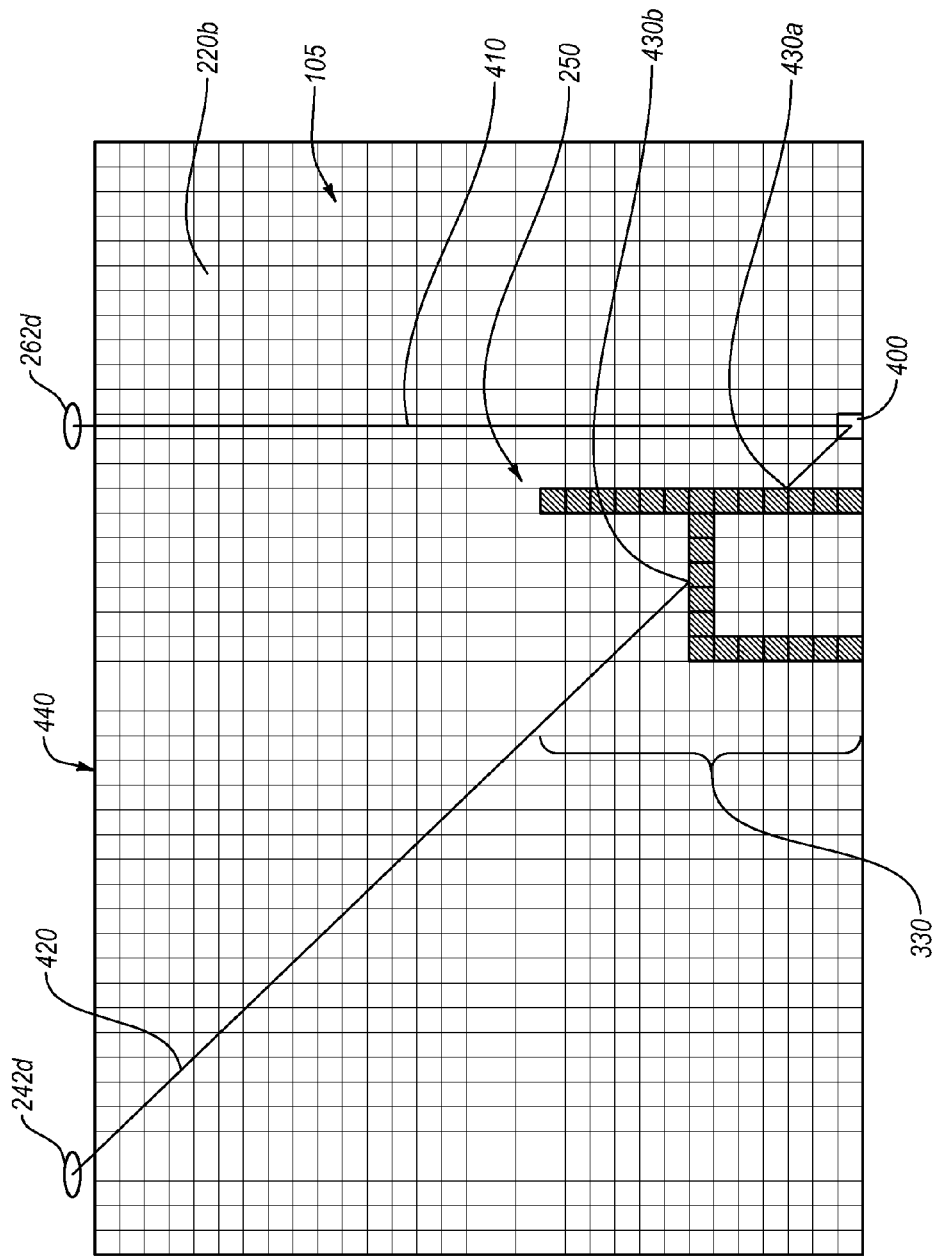
FIG. 4 illustrates a cross-sectional view of the chair within a volume map, and a ray march from multiple light sources.

After determining, creating, and assigning out at least one volume map, the pre-calculation module 142e can then calculate the lighting and shading effects with respect to at least a portion of the multi-dimensional, discrete portions. For example, FIG. 4 depicts a cross-section of the voxelized chair 330 within a voxelized room 220b. Both the voxelized chair 330 and the voxelized room 220b correspond with the chair 250 and the room 220a off depicted within the three-dimensional model of FIG. 2. Additionally, the voxelized three-dimensional model 440 corresponds with the three-dimensional model 105 of FIG. 2. For the sake of brevity and clarity, however, FIG. 4 only shows light sources 262d and 242d for purposes of efficiency in discussing the shading effect. Of course, one will appreciate that all of the light sources 242a, 242b, 242c, 242d, 262a, 262b, 262c, 262d can be included with respect to the voxelized three-dimensional model 440.

In at least one implementation, the system of the invention can calculate the shading effect with respect to each discrete portion within the voxelized three-dimensional model 440. For example, as illustrated in FIG. 4, the shading effect can be calculated with respect to voxel 400. To calculate the shading effect at voxel 400, the pre-calculation module 142e can "ray-march" (e.g., extend a ray 410, 420 from one point to another) from voxel 400 to each of the light sources individually 262d, 242d. In at least one implementation, ray marching comprises the pre-calculation model 142e determining a ray that extends between a first point and a second point within the three-dimensional model 105, 440, and sampling each voxel along the determined ray.

For example, FIG. 4 shows that ray 410 extends between light source 262d and voxel 400. The pre-calculation module 142e can sample each voxel along ray 410 to determine that the ray does not intersect with a voxelized object. Similarly, FIG. 4 shows that ray 420 extends between the voxel 400 and the light source 242d. With respect to ray 420, however, the pre-calculation module can detect that the ray 420 intersects with the voxelized chair 330 at points 430a and 430b.

In at least one implementation, the shading effects can be based upon the results of the pre-calculation module's ray-marching. For example, FIG. 4 shows that there are no occlusions between voxel 400 and light source 262d, but that there are occlusions between voxel 400 and light source 242d. Based upon the results of the ray-marching, the pre-calculation module 142e can then determine that no shadow is cast at voxel 400 by light source 262d; but, because of the position of the chair 250 within the three-dimensional model 105, a shadow is cast at voxel 400 by light source 242d.

In at least one implementation, the shading effects comprise a specific number of discrete effects (e.g., "in shadow" or "out of shadow.") For instance, if the pre-calculation module 142e determines that a shading effect exists, the pre-calculation module can then apply the effect of "in shadow" to the voxel 400, or otherwise apply the shading effect of "out of shadow." In this implementation, when the rendering module 142d rendered a three-dimensional model 105 all of the rendered shading effects could have the same attributes.

Additionally, in at least one implementation, the shading effects at each voxel can be customized to the voxel. For example, the shading effects at voxel 400 in FIG. 4 can be calculated based upon the unique interaction of the light sources 242a, 242b, 242c, 242d, 262a, 262b, 262c, 262d with voxel 400. For instance, as illustrated in FIG. 4, voxel 400 is receiving direct light from light source 262d, attenuated only (or primarily) by distance, while the effect of light 242d is blocked by the chair 150 from directly affecting voxel 400.

When calculating the shading effects on voxel 400, the pre-calculation module 142e can account for the amount of attenuated light that reaches voxel 400 from each light source 242a, 242b, 242c, 242d, 262a, 262b, 262c, 262d. Additionally, the pre-calculation module 142e can determine whether an object, such as the chair 150, completely blocks all light from a light source 242a, 242b, 242c, 242d, 262a, 262b, 262c, 262d or only partially obstructs the light. If the light is only partially blocked, the pre-calculation module 142e can account for the portion of light that is not blocked when calculating the shading effects.

In addition to calculating the shading effects at each voxel, in at least one implementation the pre-calculation module 142e can also calculate the lighting effects at each voxel. After calculating each effect, the system can store the lighting effects and shading effects together within volume maps, or the lighting effects and shading effects can be stored separately and accessed separately by the rendering module 142d during rendering. One exemplary method of calculating the lighting effects is discussed more fully below with respect to FIG. 5.

Figure 5:
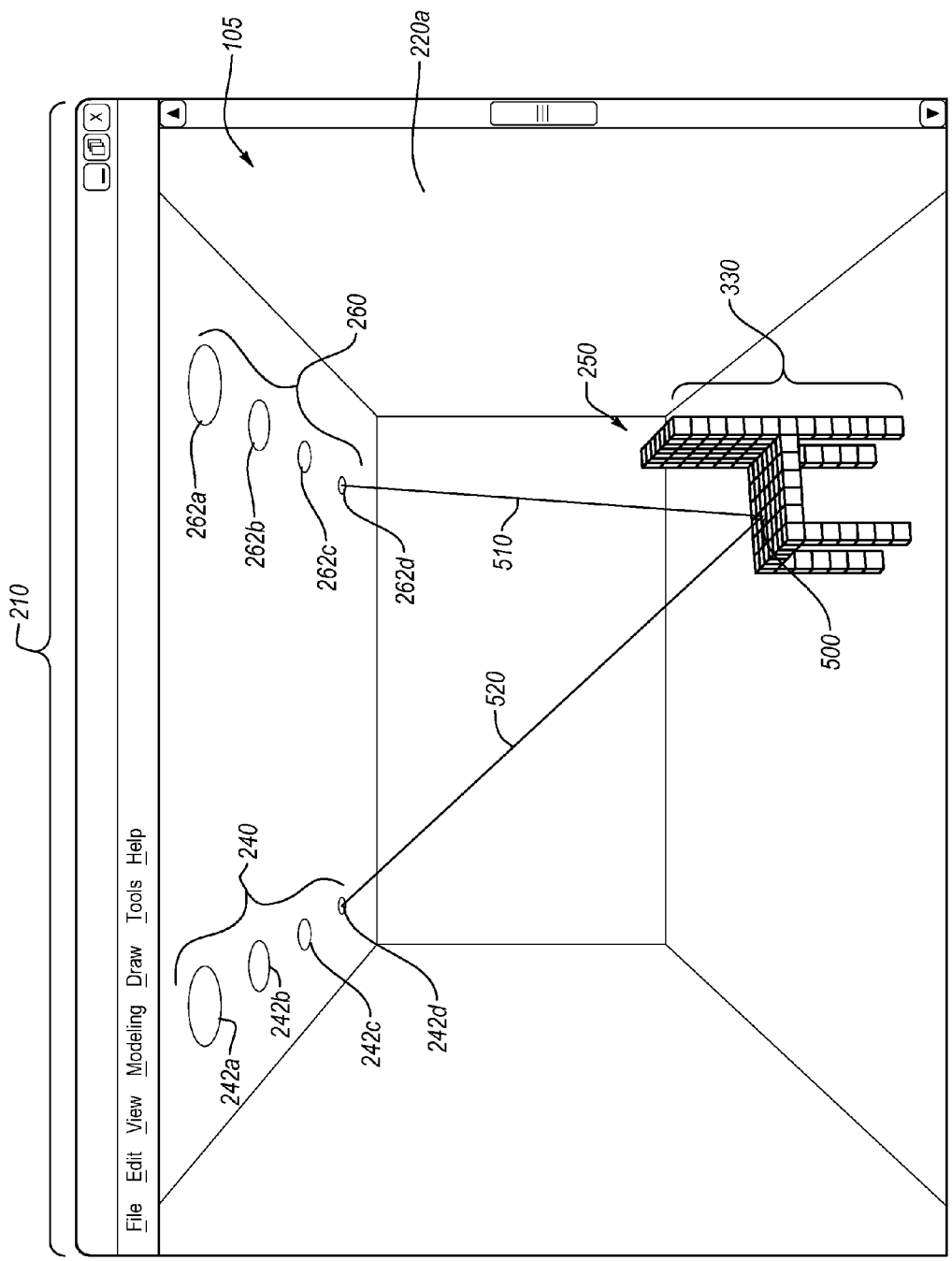
FIG. 5 illustrates the chair of FIG. 2 within the perspective of the computerized display.

For example, FIG. 5 illustrates a system and method for calculating the lighting effects at the voxel 500. FIG. 5 depicts the chair 250 in three-dimensional model 105, albeit in voxelized form 330 for illustrative purposes, and to more clearly demonstrate the calculation of the lighting effects with respect to voxel 500. (One will appreciate that, in general, the chair 250 rendered within the three-dimensional model 105 would not appear as a voxelized chair 330).

When calculating the lighting effects with respect to voxel 500, in at least one implementation, the pre-calculation module 142e can extend vectors between the voxel 500 and each light source 242a, 242b, 242c, 242d, 262a, 262b, 262c, 262d relevant to the point of view. In most cases, that will mean calculating an effect relevant to all presented light sources at the same time. For brevity in description, however, FIG. 5 illustrates ray marches with respect to two light sources. For example, FIG. 5 illustrates that the system has ray marched/extended vectors 520 and 510 from light sources 242d and 262d, respectively.

After calculating the vectors 510, 520, the pre-calculation module 142e can then calculate the lighting information at the voxel 500. In at least one implementation, the pre-calculation module can combine a light source vector 520, 510 extending from a light source 262d, 242d and a surface vector (not shown in FIG. 5, but exemplified in FIGS. 6A, 6B) to calculate the lighting information. As used within this application, "combining" two vectors includes multiplying, performing a dot product, performing a cross product, adding the vectors, dividing the vectors, or performing any other math function that results in a single number or single vector answer. For example, in at least one implementation the pre-calculation module can use one of the following equations to combine vectors in at least one calculation pursuant to calculating the lighting information at the vector 500:

$$L = A * \vec{n} \cdot \vec{l} \text{ or } L = A * \cos(\theta)$$

In the above-noted, exemplary equation, L is equal to the lighting information, $\vec{n}$ is equal to the normal vector of the surface that the light is striking (e.g., 610, FIG. 6A), and $\vec{l}$ is equal to the light source vector (e.g., 510, 520) of the light from the surface (e.g., 600, FIG. 6A) toward each respective light source. The dot product of $\vec{n}$ and $\vec{l}$ is equal to the $\cos(\theta)$, where $\theta$ is the angle between $\vec{n}$ and $\vec{l}$. Additionally, an attenuation factor A can be determined based upon the attenuation of the light between each respective light source and voxel 500. Attenuation factor A can be multiplied with either $\vec{n} \cdot \vec{l}$ or $\cos(\theta)$ to determine the actual light intensity at the surface. One will understand that the above discussed equation for calculating lighting information is only exemplary. The present invention can be practiced with any of a variety of different lighting models that comprise different equations.

The exemplary equation presented above can be solved to determine the light intensity at voxel 500 caused by light sources 262d and 242d. In other words, the equation can determine how much light should be rendered upon the surface that voxel 500 represents. For example, if a high light intensity is calculated with respect to voxel 500, then the surface that voxel 500 represents can be rendered with a great deal of lighting, as if the surface is directly under a bright light. In contrast, if the light intensity value is low then the surface can be rendered with less light and will appear to be darker or shaded.

In at least one implementation, the light intensity equation can be calculated with respect to different colors. For example, the equation can calculate the intensity of green light at voxel 500 caused by light sources 262d and 242d. Similarly, the equation can independently calculate the intensity of red light at voxel 500 caused by light sources 262d and 242d. Additionally, in at least one implementation, the result of the light intensity equation is stored as a discrete number (e.g., a number between 0 and 255). Further, in at least one implementation, the result of the light intensity equation can be stored as a High Dynamic Range format, such that the results may require more than an 8-bit color channel. One will understand that a variety of different storage formats and calculations can be used within the scope of the present invention.

In at least one embodiment, the pre-calculation module 142e may be less efficient in determining the normal vector of the particular surface that voxel 500 represents. For example, as illustrated in FIG. 5, the voxel 500 corresponds with a portion of the seat cushion 252. The seat cushion 252 as depicted in FIG. 2, however, comprises a sloped surface, in contrast with the cubic/squared shape of voxel 500. Thus, a normal vector from a surface of the voxel 500 may not be equivalent to a normal vector from the surface of the chair cushion 252. In at least one embodiment, the pre-calculation module will calculate the lighting effects at voxel 500 by using an assigned surface vector.

Figure 6B:
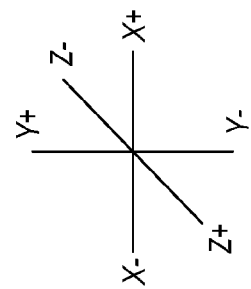
FIG. 6B illustrates a voxel comprising a normal that points in a negative x direction with respect to the voxel.
Figure 6B:
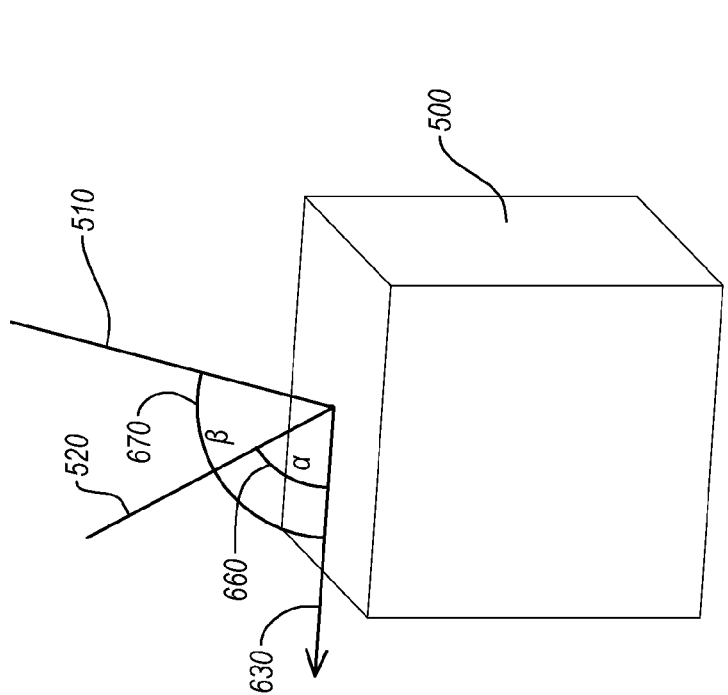
Figure 6A:
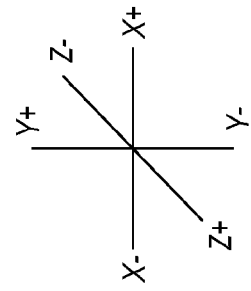
FIG. 6A illustrates a voxel comprising a normal that points in a positive y direction with respect to the voxel.
Figure 6A:
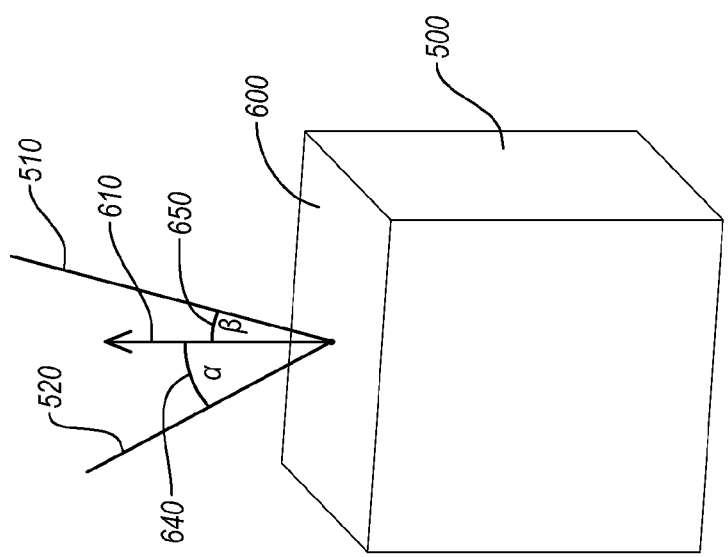

As depicted by FIG. 6A, for example, the pre-calculation module 142e can assign a positive y direction surface vector 610 (i.e., points at a 90° upwards). In the illustrated FIG. 6A, vector 520 creates an angle α 640 with the assigned positive y direction surface vector 610. Additionally, FIG. 6A shows that vector 510 creates an angle β 650 with the assigned positive y direction surface vector 610.

In at least one implementation, the pre-calculation module 142e can use the assigned positive y direction surface vector 610 along with angle α 640 and angle β 650 to calculate the light intensity at voxel 500 caused by light sources 242d and 262d. In at least one implementation, the pre-calculation module 142e can perform this calculation by determining the dot product of the assigned positive y direction surface vector 610 with each of vectors 510 and 520, multiplying each product by a respective attenuation factor, and then summing the results together. Additionally, the pre-calculation module 142e can calculate the lighting effects by multiplying amplitude A of light source 262d with the cosine of angle α 640, multiplying amplitude A of light source 242d with the cosine of angle β 650, and then summing the two products together.

Once the pre-calculation module 142e calculates the lighting effects at voxel 500 caused by each light source 242 and/or 262 in consideration, the pre-calculation module 142e can then store the calculated lighting effects information within the memory (i.e., memory 150) for later access by the rendering module 142d. In at least one implementation, the calculated lighting effects information can be stored within a "volume map." In one implementation, a volume map comprises a multi-dimensional matrix that is indexed to spatially correlate with the three-dimensional model 105.

The pre-calculation module 142e can, in turn, use multiple volume maps to calculate the lighting effects at a particular point within the three-dimensional model 105. For example, using multiple volume maps, the pre-calculation module 142e can in some cases more accurately approximate the normal vector of the seat cushion 252. By contrast, when using only a single volume map, with a single assigned surface vector, the accuracy of the lighting effects calculations might depend upon how closely the actual surface normal vector of the surface of the chair cushion 252 is to the assigned surface vector.

FIG. 6B illustrates voxel 500 with an assigned negative x direction surface vector 630 (i.e. points at a 90° left with respect to the viewer of the figure). In at least one implementation, the voxel 500 of FIG. 6B can belong to a different volume map than the voxel 500 of FIG. 6A, but in both volume maps, voxel 500 can correspond to the same portion of the chair cushion 500. One will appreciate that any particular volume map can contain one or multiple voxels.

Similar to the implementation recited with respect to FIG. 6A, the pre-calculation module 142e can use the assigned negative x direction surface vector 630 along with angle α 660 and angle β 670 to calculate the light intensity at voxel 500 caused by light sources 242d and 262d. In at least one implementation, the pre-calculation module 142e can perform this calculation by determining the dot product of the assigned negative x direction surface vector 630 with each of vectors 510 and 520, multiplying each product by a respective attenuation factor, and then summing the results together. Additionally, the pre-calculation module 142e can calculate the lighting effects by multiplying amplitude A of light source 262d with the cosine of angle α 660, multiplying amplitude A of light source 242d with the cosine of angle β 670, and then summing the two products together.

In any event, the voxels within each volume map can correspond to distinct portions of the three-dimensional model. Further, in at least one implementation, all of the voxels within each respective volume map can comprise assigned surface vectors that point in the same direction as the other assigned surface vectors within the same volume map. For instance, in at least one implementation, all of the voxels within the same volume map as voxel 500 from FIG. 6A have assigned surface vectors pointing in the positive y direction, and all of the voxels within the same volume map as voxel 500 from FIG. 6B have assigned surface vectors pointing in the negative x direction Furthermore, in at least one implementation the pre-calculation module 142e can create more than two volume maps. For example, the pre-calculation module 142e can create six volume maps with each volume map comprising a distinct assigned surface vector. Specifically, in at least one implementation, the pre-calculation module 142e can create six volumes maps comprising assigned surface vectors that point in the positive x direction, negative x direction, positive y direction, negative y direction, positive z direction, and negative z direction, respectively. Upon calculating each of the volume maps the pre-calculation module 142e can store the calculation within memory 150 (and/or storage 160) for the rendering module 142d to access. The rendering module 142d, in turn, can use multiple volume maps to render the lighting effects on a particular portion of a surface.

Additionally, in at least one implementation, the pre-calculation module 142e can create volume maps that are comprised of assigned surface vectors that are not aligned with an axis. For example, the pre-calculation module 142e can create a volume map that is comprised of assigned surface vectors that point in a 45 degree direction with respect to the x axis. Further, in at least one implementation, the pre-calculation module 142e can assign a plurality of surface vectors to two or more volume maps, such that the plurality of surface vectors forms a basis in vector space.

Figure 7:
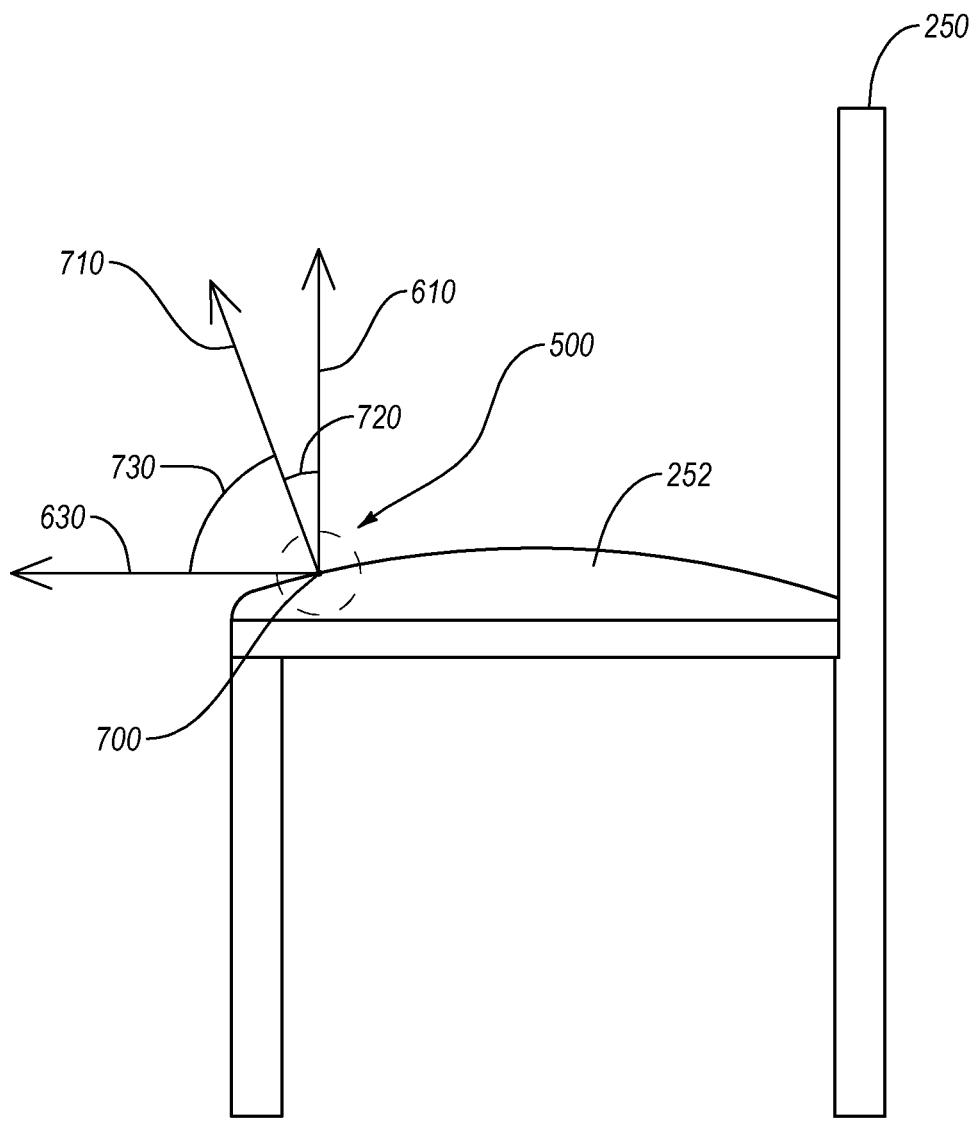
FIG. 7 illustrates a side view of a chair, showing a plurality of vectors drawn with respect to a portion of the chair.

FIG. 7 illustrates a side view of rendered chair 250. In the illustrated case, surface area 700 corresponds to the area of the seat cushion 252 that voxel 500 encompasses, while surface normal 710 represents the surface normal of surface area 700, as calculated by rendering module 142d. Since the surface area 700 and surface normal 710 have been determined at this point, the rendering module 142d can access the volume maps that were created by the pre-calculation module 142e. Specifically, the rendering module 142d can access the volume maps that correspond to voxel 500 in FIGS. 6A and 6B, respectively.

In this case, rendering module 142d identifies that one assigned surface vector 610 points in the positive y direction (e.g., from FIG. 6A) and that another assigned surface vector 630 points in the negative x direction (e.g., from FIG. 6B). The rendering module 142d can then utilize the lighting effects data that was calculated by the pre-calculation module 142e for both the positive y direction volume map, and for the negative x direction volume map. In addition, the rendering module 142d can determine the angle between the surface normal vector 710 and each respective assumed normal vector, such as 610 and 630.

For example, FIG. 7 show that the assigned positive y direction surface vector 610 and the surface normal vector 710 form angle 720; while, the assigned negative x direction surface vector 630 and the surface normal vector 710 form angle 730. The rendering module 142d can determine the lighting effects at surface 700 by weighting the lighting effects information stored within the volume maps with respect to angles 730 and 720.

For example, FIG. 7 shows that angle 720 is much smaller than angle 730, which in this case is because positive y direction surface vector 610 is a much closer approximation of the surface normal vector 710 than the negative x direction surface vector 630. Using this information, the rendering module 142d calculates that lighting effect at surface 700 by interpolating between the lighting effects calculated by the volume map of the positive y direction surface vector 610 and the volume map of the negative x direction surface vector 630. For example, the rendering module 142d can weight the lighting effects information that is stored within the volume maps, such that the information stored in the volume map of the positive y direction normal vector 610 is weighted inversely proportional to the size of angle 720 with respect to angle 730. Similarly, the rendering module 142d can weight the lighting effects information stored within the negative x direction volume map, such that the information is weighted inversely proportional to the size of angle 730 with respect to angle 720. In at least one implementation, the rendering module 142d can then add the weighted lighting effects information together to generate the lighting effects at surface 700.

For instance, in at least one implementation, the lighting effect information comprises light intensity numbers. For example, the light intensity number that is associated with the volume map of the negative x direction may indicate a low level of light intensity. In contrast, the light intensity number that is associated with the volume map of the positive y direction may indicate a high level of light intensity. Because the surface normal vector 710 is much closer to the positive y direction surface vector 610 than it is to the negative x direction surface vector 630, the high level of light intensity indicated by the volume map of the positive y direction can have a larger impact on the interpolated lighting effect than the light intensity associated with the volume map of the negative x direction.

As previously mentioned, FIG. 7 only depicts two assigned surface vectors 630 and 610 (for clarity and brevity), which each can be associated with two distinct volume maps. One will understand, however, that multiple volume maps can be used, such that the lighting effects at the surface 700 are calculated by weighting the lighting effects information stored within the multiple volume maps with respect to the angles they make with the surface normal vector 710. Additionally, one will understand that if six volume maps are created by the pre-calculation module 142e with each volume having assigned surface vectors pointing in the positive x direction, negative x direction, positive y direction, negative y direction, positive z direction, and negative z direction, respectively, the rendering module 142d can determine the lighting effects at surface 700 using only information from three of the volume maps. In at least one implementation, any specific point within a three-dimensional model space can be mapped using only three of the volume maps.

Additionally, in at least one embodiment, the rendering module 142d can calculate lighting effects on surface 700 using vector math. For example, the rendering module 142d can calculate a unit surface normal vector 710. In at least one implementation, a vector other than a unit vector can be used as described below to calculate the lighting effects. The rendering module 142d can calculate a lighting effects x-component by multiplying the x component of the unit surface normal vector 710 with the information that is generated from the assigned surface vector pointing in the negative x direction 630. Similarly, the rendering module can generate a lighting effects y-component by multiplying the y component of the unit surface normal vector 710 with the information that is generated from the assigned surface vector in the positive y direction 610. In at least one embodiment, the lighting effects x-component can be added to the lighting effects y-component to calculate the lighting effect on surface 700. One will understand that similar calculations for the lighting effects can be performed with respect to a vector pointing in a z-direction or with respect to any set of vectors that form a basis with a vector space.

Similarly to what was stated above, one will understand that multiple volume maps can be used for lighting effects at the surface 700. To do so, rendering module 142d can multiply the different components of the unit normal vector with the corresponding information from a volume map. Additionally, one will understand that if six volume maps are created by the pre-calculation module 142e with each volume having assumed normal vectors pointing in the positive x direction, negative x direction, positive y direction, negative y direction, positive z direction, and negative z direction, respectively, the rendering module 142d can determine the lighting effects at surface 700 using only information from three of the volume maps. In at least one implementation, any specific point within the three-dimensional model 105 can be mapped using only three of the volume maps.

One will understand that the above disclosed methods for calculating lighting effects within a three-dimensional model 105 can allow the rendering module 142d to render a lighting effect during a time interval that is independent of the number of light sources within the design space. Specifically, in at least one implementation the rendering module 142d takes the same amount of time to render the lighting effect generated by a single light source as it takes to render the lightings effect generated by multiple light sources. The described real-time rendering speed can be achieved by pre-calculating into volume maps the lighting effects caused by the plurality of light sources.

After pre-calculating the volume maps, the rendering module 142d is no longer required to calculate the lighting effects from each light source in real time. Instead, the rendering module 142d can access the pre-calculated volume maps and utilize the pre-calculated lighting effect information that is stored within each respective volume map. Additionally, in at least one implementation of the present invention, the rendering module 142d can render a lighting effect caused by a plurality of light sources on a particular surface by accessing information stored in only three volume maps. In this implementation, the rendering module 142d can render a lighting effect in the amount of time it takes the rendering module 142d to access the three-volume maps and perform simple multiplication and addition. In contrast, a conventional computer design system will typically calculate the lighting effect on a particular surface by ray tracing between the surface and each of the plurality light sources within the three-dimensional model 105, and will then perform mathematical operations to determine the total lighting effect.

For example, as depicted in FIG. 2, the lighting effects caused by the eight distinct light sources 242a, 242b, 242c, 242d, 262a, 262b, 262c, and 262d can be pre-calculated into a one or more volume maps. The rendering module 142d, when rendering a lighting effect at a surface, can access a single volume map, or in some cases multiple volume maps, in order to render the lighting effect. This is in contrast to the rendering module 142d calculating the lighting effect at a surface by individually calculating the influence that each of the eight light sources 242a, 242b, 242c, 242d, 262a, 262b, 262c, 262d has upon the particular surface and then adding the calculations together. Additionally, when using vector math, the rendering module 142d can use the information stored within the volume maps to calculate lighting effects using multiplication and addition operations which can be significantly faster than the mathematical operations required to calculated lighting effects in real time without the pre-calculated volume maps.

Furthermore, in at least one implementation, the pre-calculation module 142e only calculates the lighting effects within the three-dimensional model 105 when the scene is first rendered, and when the user makes a change to the scene. Additionally, in at least one implementation, when a user makes a change to the three-dimensional model 105, the pre-calculation module 142e recalculates only those portions of the three-dimensional model that were influenced by the change. For example, if the design module 142b receives an indication from a user to move the chair 250 of FIG. 2, then the changes to the light effects are predominantly centered around the previous location of the chair 250 and the new location of the chair 250. The pre-calculation module 142e, in at least one implementation, can be more efficient by only recalculating those areas where the lighting effect has changed. For example, areas that continue to remain occluded relative to a light source will thus remain shaded by the same amount, and do not need to be recalculated.

Accordingly, FIGS. 1-7 and the corresponding text illustrate or otherwise describe one or more components, modules, and/or mechanisms for efficiently calculating and rendering lighting effects in real-time. One will appreciate that implementations of the present invention can also be described in terms of flowcharts comprising one or more acts for accomplishing a particular result. For example, FIGS. 8 and 9 and the corresponding text described acts in a method for calculating lighting effects in real time. The acts of FIGS. 8 and 9 are described below.

Figure 8:
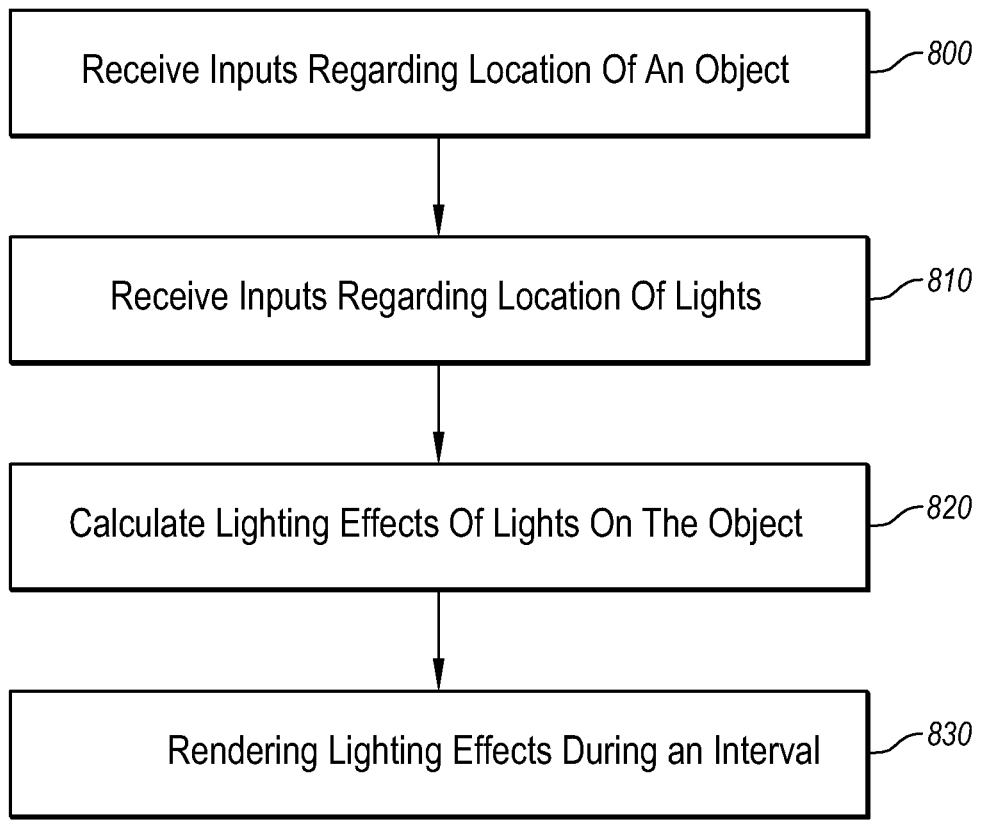
FIG. 8 illustrates a flow chart of a series of acts in a method in accordance with an implementation of the present invention for providing a real-time calculation time for calculating a lighting portion of a scene irrespective of the number of light sources within the scene.
Figure 9:
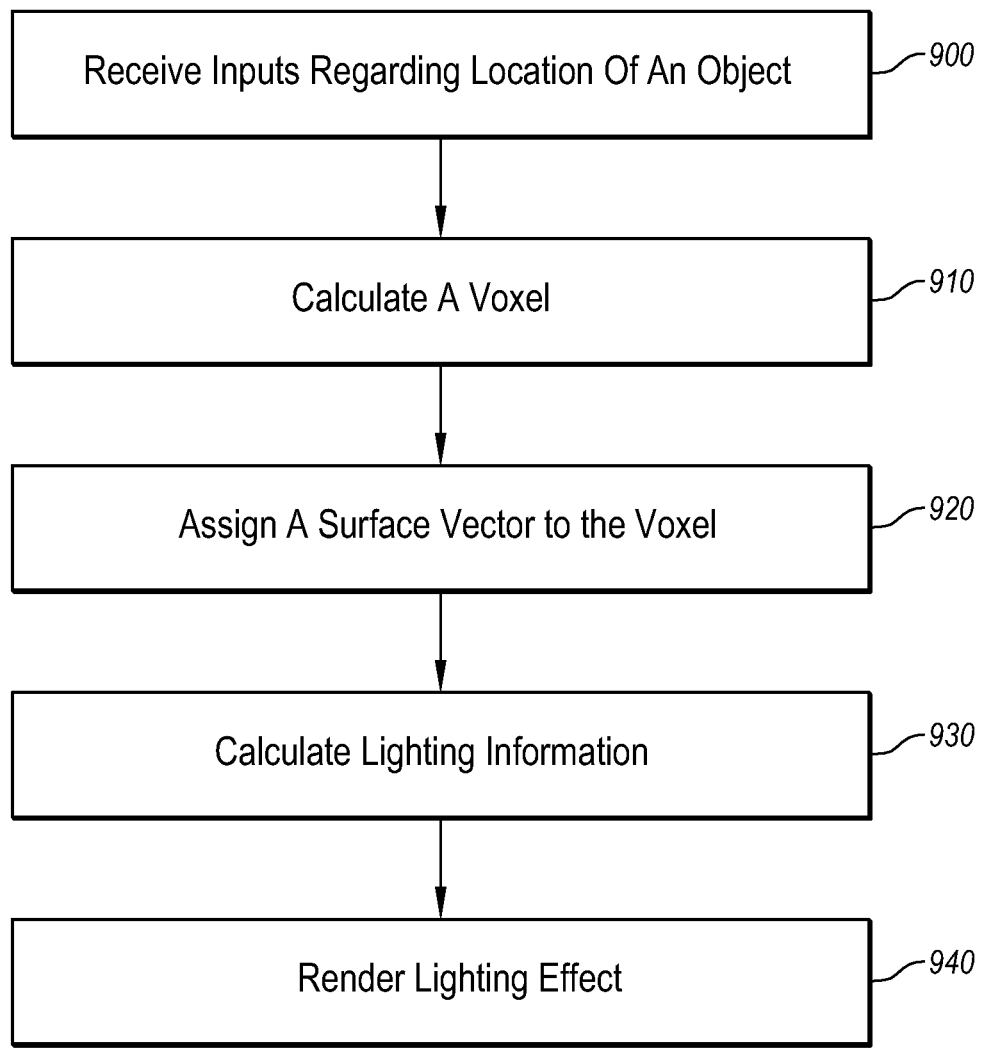
FIG. 9 illustrates another flow chart of a series of acts in a method in accordance with an implementation of the present invention for providing a real-time calculation time for calculating a lighting portion of a scene irrespective of the number of light sources within the scene.

For example, FIG. 8 illustrates that a method for rendering the lighting effects of a scene during a consistent time interval irrespective of the number of light sources within the scene can comprise an act 800 of receiving inputs regarding the location of an object. Act 800 includes receiving from a user one or more user inputs regarding a location of an object in a design space. For example, FIGS. 1 and 2 show that a design software application 140 can receive inputs regarding the location of a chair 250 within the three-dimensional model 105.

FIG. 8 also shows that the method can comprise an act 810 of receiving inputs regarding the location of lights. Act 810 includes receiving from a user one or more user inputs regarding the location of one or more lights within the design space, wherein the one or more light sources project onto the object. For example, FIG. 2 shows that a design software application 140 can receive inputs on the placement of multiple light sources (262*a*, 262*b*, etc.) within a three-dimensional model 105 of a room 220*a*.

Furthermore, FIG. 8 shows that the method can comprise an act 820 of calculating lighting effects of lights on the object. Act 820 can include calculating a lighting effect of the one or more lights on the object in the design space. For example, FIGS. 4, 5, 6A, 6B, and 7 show a design software application 140 calculating the lighting effect of lights 242*d* and 262*d* on the chair 250. In at least one implementation, calculating the lighting effect includes combining one or more vectors that extend from a light source to a particular voxel with one or more surface vectors extending from the voxel. The resulting lighting information can then be used to interpolate the rendered lighting effect using the methods described above.

In addition, FIG. 8 shows that the method can comprise an act 830 of rendering the lighting effect during an interval. Act 830 can include rendering the lighting effect during a time interval that is independent of the number of the one or more light sources within the design space, whereby rendering the lighting effect for one of the one or more light sources takes the same amount of time as rendering the lighting effect for a plurality of the light sources. For example, FIGS. 1 and 7 show that a design software application 140 can calculate the lighting portion of scene in real-time during a time interval that is independent of the number of the one or more light sources within the design space. As explained above, in at least one implementation the rendering module 142*e* can render a lighting effect caused by any number of light sources in the amount of time it takes the rendering module 142*e* to access three volume maps. In other words, the interval of time that is required to render the lighting effects is defined by the amount of time it takes for the rendering module 142*e* to access the three volume maps, and is completely independent of the number of light sources within the three-dimensional model 105.

Additionally, FIG. 9 shows that a method of maintaining a real-time calculation time for calculating a lighting portion and a shading portion of a scene irrespective of a number of light sources within the scene can comprise an act 900 of receiving inputs regarding the location of an object. Act 900 includes receiving from a user one or more user inputs regarding a location of an object in a design space. For example, FIGS. 1 and 2 show that a design software application can receive inputs regarding the location of a chair 250 within the three-dimensional model 105.

FIG. 9 also shows that the method can comprise an act 910 of calculating a voxel. Act 910 includes calculating a voxel, wherein the voxel represents at least a discrete portion of the object in the design space. For example, FIGS. 3-6B show that a design software application 140 can calculate a voxel for a chair 250 within a three-dimensional model 105 of room 220*a*.

Furthermore, FIG. 9 shows that the method can comprise an act 920 of assigning a surface vector to a voxel. Act 920 comprises assigning at least one surface vector to the voxel, wherein the at least one surface vector extends from the voxel. For example, FIGS. 6A and 6B show two different voxels being assigned surface vectors. Specifically, FIG. 6A shows a voxel being assigned a surface vector pointing in the positive y direction, and FIG. 6B shows a voxel being assigned a surface vector pointing in the negative x direction.

In addition, FIG. 9 shows that the method can also comprise an act 930 of calculating lighting information. An act 930 includes calculating lighting information generated by the light source on the voxel by combining a light source vector extending from the light source and the at least one surface vector. For example, FIGS. 6A, 6B, and 7 show a design software application calculating lighting information by combining a light source vector and at least one surface vector.

FIG. 9 also shows that the method can comprise act 940 of rendering a lighting effect. Act 940 includes rendering, using the lighting information, the lighting effect on the discrete portion of the object in the design space. For example, FIGS. 2 and 7 show a design software application rendering a chair 250 within a three-dimensional model 105.

Accordingly, FIGS. 1-9 provide a number of components, schematics, and mechanisms for providing for the capture, rending, displaying, navigating and/or viewing of the geometry of one or more three-dimensional models. Additionally, one or more implementations can allow a rendering module 142*d* to render a three-dimensional model 105 in real-time without respect to the number of light sources within the model. Furthermore, one or more implementations can allow for the pre-calculation of lighting and shading effects. Additionally, the pre-calculated effects can be stored within one or more volume maps. One will appreciate that the components and mechanisms described herein can greatly simplify the rendering of lighting effects caused by multiple light sources within a three-dimensional model. For example, the components and mechanisms described herein allow a user to navigate within the three-dimensional model, while lighting effects from multiple light sources are rendered in real time. Additionally, components and mechanisms described herein allow a design software application to render realistic lighting effects that are associated with a plurality of light sources.

The embodiments of the present invention may comprise a special purpose or general-purpose computer including various computer hardware components, as discussed in greater detail below. Embodiments within the scope of the present invention also include computer-readable media for carrying or having computer-executable instructions or data structures stored thereon. Such computer-readable media can be any available media that can be accessed by a general purpose or special purpose computer.

By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

I claim:

1. In a computerized architectural design environment in which a design program is loaded into memory and processed at a central processing unit, a computer-implemented method for rendering the lighting effects of a scene during a consistent time interval irrespective of the number of light sources within the scene, the method comprising:
    receiving from a user one or more user inputs regarding a location of an object in a design space;
    receiving from the user one or more user inputs regarding a location of one or more lights within the design space, wherein the one or more light sources project onto the object;
    calculating a lighting effect of the one or more lights on the object in the design space, wherein calculating the lighting effect comprises:
        generating a voxel that encloses at least a discrete portion of the object in the design space,
        generating a first surface vector that extends from a first surface of the voxel and points in a first direction;
        generating a second surface vector that extends from a second surface of the voxel and points in a second direction that is different than the first direction,
        calculating first lighting information generated by the one or more light sources on the first surface by combining light source vectors extending from each of the one or more light sources and the first surface vector, wherein the first surface vector is normal to the surface of the voxel;
        calculating second lighting information generated by the one or more light sources on the second surface by combining light source vectors extending from each of the one or more light sources and the second surface vector, wherein the second surface vector is normal to the second surface of the voxel; and
    rendering at least the discrete portion of the object in the design space;
    calculating a normal vector from a surface of the rendered discrete portion of the object;
    rendering the lighting effect on the discrete portion of the object by interpolating a lighting effect from the first lighting information and the second lighting information based upon a relationship between the normal vector from the surface of the rendered discrete portion of the object and the first surface vector and the second surface vector, wherein the normal vector from the surface of the rendered discrete portion of the object is normal to the surface of the rendered discrete portion of the object, the first surface vector is normal to the first surface of the voxel, and the second surface vector is normal to the second surface of the voxel.

2. The method as recited in claim 1, wherein calculating a lighting effect of the one or more lights on the object in the design space comprises:
    creating a volume map of the object within the design space by dividing the object in the design space into a plurality of discrete segments; and
    calculating the lighting effect on at least one of the plurality of discrete segments.

3. The method as recited in claim 2, wherein calculating the lighting effect on the at least one of the plurality of discrete segments comprises associating an assigned surface vector with each of the plurality of discrete segments, wherein the assigned surface vector points in a particular direction.

4. The method as recited in claim 2, further comprising:
    creating multiple volume maps of the object within the design space; and
    calculating the lighting effect on the at least one of the plurality of discrete segments within each volume map.

5. The method as recited in claim 4, further comprising:
    creating six volume maps of the object in the design space; and
    associating assigned surface vectors with all of the discrete segments within each respective volume map, such that the assigned surface vectors within each respective volume map point in the same direction.

6. The method as recited in claim 5, further comprising:
    associating with the discrete segments in a first volume map assigned surface vectors that point in a positive x direction;
    associating with the discrete segments in a second volume map assigned surface vectors that point in a negative x direction;
    associating with the discrete segments in a third volume map assigned surface vectors that point in a positive y direction;
    associating with the discrete segments in a fourth volume map assigned surface vectors that point in a negative y direction;
    associating with the discrete segments in a fifth volume map assigned surface vectors pointing in a positive z direction; and
    associating with the discrete segments in a sixth volume map assigned surface vectors point in a negative z direction.

7. The method as recited in claim 6, further comprising rendering the lighting effect during a time interval that is independent of the number of the one or more light sources within the design space.

8. The method as recited in claim 1, further comprising:
calculating at least one ray extending from the first voxel to at least one light source within the scene;
determining that the at least one ray extending between the first voxel and the at least one light source in the scene intersects with a surface; and
calculating the lighting effect information based upon the intersection of the at least one ray with the surface, wherein the lighting effect information comprises a shading effect.

9. The method as recited in claim 8, further comprising storing the calculated shading effect within a volume map.

10. The method as recited in claim 1, wherein:
the normal vector from the surface of the rendered discrete portion of the object comprises a unit normal vector;
the first surface vector comprises a vector pointing in an axial direction within an x, y, z coordinate system;
the second surface vector comprises a vector pointing in a different axial direction within an x, y, z coordinate system; and
interpolating a lighting effect comprises multiplying the first surface vector and the second surface vector with the unit normal vector.

11. In a computerized architectural design environment in which a design program is loaded into memory and processed at a central processing unit, a computer-implemented method for rendering a lighting effect from one or mores light sources on an object within a design space, the method comprising:
receiving from a user one or more inputs regarding a location of the object in the design space;
calculating a voxel, wherein the voxel encloses at least a discrete portion of the object in the design space;
assigning a first surface vector to a first surface of the voxel, wherein the first surface vector is normal to the first surface;
assigning a second surface vector to a second surface of the voxel, wherein the second surface vector is normal to the second surface and points in a different direction than the first surface vector;
calculating first lighting information generated by the one or more light sources on the first surface of the voxel by combining light source vectors extending from the one or more light sources and the first surface vector;
calculating second lighting information generated by the one or more light sources on the second surface of the voxel by combining light source vectors extending from the one or more light sources and the second surface vector; and
rendering, using the first lighting information, the second lighting information, and a normal vector extending from a rendered surface of the portion of the object, the lighting effect on the discrete portion of the object in the design space.

12. The method as recited in claim 11, further comprising:
calculating a voxel map for at least the object in the design space, wherein the voxel map is associated with a plurality of light sources in the design space;
calculating a shading effect on the voxel, wherein calculating a shading effect on the voxel comprises determining whether any of a plurality of rays extending between the voxel and each of the plurality of light sources in the design space intersects with a surface.

13. The method as recited in claim 12, wherein rendering the lighting effect on the object in the design space comprises using the shading effect, the lighting information, and a normal vector of the discrete portion of the object to interpolate the lighting effect on the object in the design space.

14. The method as recited in claim 11, further comprising:
associating with discrete segments in a first volume map assigned surface vectors that point in a positive x direction;
associating with discrete segments in a second volume map assigned surface vectors that point in a negative x direction;
associating with discrete segments in a third volume map assigned surface vectors that point in a positive y direction;
associating with discrete segments in a fourth volume map assigned surface vectors that point in a negative y direction;
associating with discrete segments in a fifth volume map assigned surface vectors pointing in a positive z direction; and
associating with discrete segments in a sixth volume map assigned surface vectors point in a negative z direction.

15. The method as recited in claim 14, further comprising:
calculating a plurality of volume cube maps, wherein each volume cube map comprises one or more voxels that represent various portions of the design space; and
assigning to each volume cube map a surface vector, such that all of the one or more voxels within each respective volume cube map comprise the same surface vector.

16. The method as recited in claim 15, wherein rendering, using the lighting information, the lighting effect on the discrete portion of the object in the design space comprises using information from only three of the calculated volume cube maps.

17. The method as recited in claim 15, wherein assigning to each volume cube map a surface vector, comprises assigning surface vectors to the plurality of volume cube maps such that the surface vectors create a basis for a vector space.

18. The method as recited in claim 11, wherein the lighting effect is re-rendered a plurality of times without re-calculating either the shading effect or the light intensity.

19. The method of claim 11, wherein the normal vector comprises a unit vector.

20. A computer system for maintaining a real-time rendering time for rendering the lighting effects of a scene during a time interval that does not increase with respect to the number of light sources within the scene, comprising:
one or more processors; and
one or more computer-readable media having stored thereon executable instructions that when executed by the one or more processors configure the computer system to perform at least the following:
receive from a user one or more user inputs regarding a location of an object in a design space;
receive from the user one or more user inputs regarding a location of one or more light sources within the design space, wherein the one or more light sources project onto the object;
calculate a lighting effect of the one or more light sources on the object in the design space, wherein calculating the lighting effect comprises:
generating a voxel that encloses at least a discrete portion of the object in the design space,
generating a first surface vector that extends from a first surface of the voxel and points in a first direction;

generating a second surface vector that extends from a second surface of the voxel and points in a second direction that is different than the first direction, calculating first lighting information generated by the one or more light sources on the voxel by combining light source vectors extending from each of the one or more light sources and the first surface vector, wherein the first surface vector is normal to the first surface;

calculating second lighting information generated by the one or more light sources on the voxel by combining light source vectors extending from each of the one or more light sources and the second surface vector, wherein the second surface vector is normal to the second surface;

rendering at least a portion of the object in the design space; and calculating a normal vector from a surface of the rendered discrete portion of the object; and render the lighting effect on the discrete portion of the object by interpolating a lighting effect from the first lighting information and the second lighting information based upon a relationship between the normal vector and the first surface vector and the second surface vector.

* * * * *